(12) United States Patent
Stark et al.

(10) Patent No.: US 10,859,610 B2
(45) Date of Patent: Dec. 8, 2020

(54) VOLTAGE DETECTOR AND VOLTAGE DETECTOR SYSTEM

(71) Applicant: The University of Bristol, Clifton Bristol (GB)

(72) Inventors: Bernard Stark, Bristol (GB); Guang Yang, Bristol (GB); Chunhong Zhang, Xi'an (CN); Plamen Proynov, Bristol (GB); Salah Adami, Bristol (GB)

(73) Assignee: The University of Bristol, Clifton Bristol (GB)

( * ) Notice: Subject to any disclaimer, the term of this patent is extended or adjusted under 35 U.S.C. 154(b) by 39 days.

(21) Appl. No.: 16/096,792

(22) PCT Filed: Apr. 27, 2017

(86) PCT No.: PCT/GB2017/051185
§ 371 (c)(1),
(2) Date: Oct. 26, 2018

(87) PCT Pub. No.: WO2017/187181
PCT Pub. Date: Nov. 2, 2017

(65) Prior Publication Data
US 2020/0124646 A1 Apr. 23, 2020

(30) Foreign Application Priority Data

Apr. 27, 2016 (GB) .................................. 1607304.1

(51) Int. Cl.
*G01R 19/165* (2006.01)
*G05F 3/24* (2006.01)
(Continued)

(52) U.S. Cl.
CPC ....... *G01R 19/16576* (2013.01); *G01R 15/04* (2013.01); *G01R 19/16519* (2013.01);
(Continued)

(58) Field of Classification Search
None
See application file for complete search history.

(56) References Cited

U.S. PATENT DOCUMENTS 5,063,304 A * 11/1991 Iyengar .................. G11C 5/147
327/310
5,120,993 A * 6/1992 Tsay ........................ G05F 3/205
327/546
(Continued)

FOREIGN PATENT DOCUMENTS

CN 202711108 10/2012
EP 0433696 8/1991
(Continued)

OTHER PUBLICATIONS

S.Y. Wu; IEEE International Conference of Electron Device and Solid-state circuits, Design and realization of a voltage detector based on current comparison in a 40nm technology, 2013, p. 1-2.
(Continued)

*Primary Examiner* — Lincoln D Donovan
*Assistant Examiner* — Khareem E Almo
(74) *Attorney, Agent, or Firm* — Burns & Levinson, LLP; George N. Chaclas

(57) ABSTRACT

A voltage detector comprising: a first voltage reference generator for generating a first voltage reference signal; a second voltage reference generator for generating a second voltage reference signal, wherein the second voltage reference signal is higher than the first voltage reference signal; a trigger, powered by an input signal to the voltage detector, and having an input for receiving either the first or second voltage reference signal and an output for generating a detection signal; and a switch for selectively, connecting the input of the trigger to the first or second voltage reference
(Continued)

signal, wherein the switch is operative to connect the input of the trigger to the first voltage reference signal when the detection signal output by the voltage detector is low and is operative to connect the input of the trigger to the second voltage reference signal when the detection signal output by the voltage detector is high, and a voltage detector system for monitoring an input signal and outputting a detection signal when a voltage of the input signal meets a first threshold, the voltage detector system comprising: a first voltage detector having an input for receiving the input signal and an output for outputting a detection signal, wherein the first voltage detector is configured to output the detection signal when the voltage of the input signal meets a first rising input voltage threshold; a second voltage detector having an input for receiving the input signal and an output for outputting a detection signal, wherein the second voltage detector is configured to output the detection signal when the voltage of the input signal meets a second rising input voltage threshold which is higher than the first threshold, wherein the output of the second voltage detector controls a connection between the input signal and the input of the first voltage detector such that when the voltage the input signal meets the second rising input voltage threshold the connection between the input and the input of the first voltage detector is inhibited or disconnected.

18 Claims, 14 Drawing Sheets

(51) Int. Cl.
  *H03K 17/22* (2006.01)
  *G01R 15/04* (2006.01)
  *G05F 3/10* (2006.01)
(52) U.S. Cl.
  CPC ......... *G01R 19/16538* (2013.01); *G05F 3/10* (2013.01); *G05F 3/24* (2013.01); *H03K 17/223* (2013.01)

(56) References Cited

U.S. PATENT DOCUMENTS

| | | | |
|---|---|---|---|
| 5,136,182 A | 8/1992 | Fawal | |
| 5,206,581 A | 4/1993 | Yoshida | |
| 5,343,086 A * | 8/1994 | Fung | G05F 1/565 327/530 |
| 5,495,453 A * | 2/1996 | Wojciechowski | G11C 5/143 365/185.18 |
| 5,594,360 A * | 1/1997 | Wojciechowski | G01R 19/16576 365/226 |
| 6,545,510 B1 | 4/2003 | Cowles | |
| 7,084,692 B2 * | 8/2006 | Peron | H02M 1/08 327/322 |
| 7,663,429 B2 * | 2/2010 | Wang | H03F 3/21 327/536 |
| 7,873,856 B2 * | 1/2011 | Westwick | H03K 17/223 713/340 |
| 2007/0001714 A1 | 1/2007 | Zolfaghari | |
| 2009/0201010 A1 * | 8/2009 | Shin | G01R 19/16576 324/98 |
| 2010/0283516 A1 | 11/2010 | Choi | |
| 2011/0095789 A1 | 4/2011 | Tang et al. | |
| 2012/0283516 A1 | 11/2012 | Kang et al. | |
| 2012/0323508 A1 | 12/2012 | Boas Vilas et al. | |
| 2016/0018446 A1 * | 1/2016 | Chen | G01R 19/1659 363/56.05 |
| 2016/0164428 A1 * | 6/2016 | Chen | G01R 19/0007 307/130 |
| 2020/0072878 A1 * | 3/2020 | Pollak | H03K 17/08122 |

FOREIGN PATENT DOCUMENTS

| | | |
|---|---|---|
| EP | 0718740 | 7/1996 |
| EP | 2320295 | 5/2011 |
| GB | 2308453 | 6/1997 |
| JP | 58196464 | 11/1983 |
| JP | 61101821 | 5/1986 |
| WO | 2015/072522 | 5/2015 |

OTHER PUBLICATIONS

International Search Report and Written Opinion for PCT Application No. PCT/GB2017/051185, dated Jul. 24, 2017, 17 pages.

* cited by examiner

VOLTAGE DETECTOR AND VOLTAGE DETECTOR SYSTEM

CROSS-REFERENCE TO RELATED APPLICATIONS

This application is the U.S. national phase entry under 35 U.S.C. § 371 of International Application No. PCT/GB2017/051185, filed Apr. 27, 2017, entitled VOLTAGE DETECTOR AND VOLTAGE DETECTOR SYSTEM, which in turn claims priority to and benefit of Great Britain Application No. 1607304.1, filed Apr. 27, 2016; each of which is incorporated herein by reference in their entirety for all purposes.

TECHNICAL FIELD

The present application relates to a voltage detector and a voltage detector system.

BACKGROUND TO THE INVENTION

Sensors such as those used in medical devices can be powered by wireless power transfer or energy harvesting sources. In the case of sensors that are worn on the human body, these sources provide intermittent power due to the body's movement. For example, if the wearer of the device rests in a position such that a power receiving antenna is poorly oriented relative to the transmitter, then an input power lull occurs. This problem of intermittency occurs with the majority of energy generation and wireless power transfer techniques, and is only exacerbated when some of the system is situated on a moving body.

FIG. 1 provides a schematic illustration of a sensor system that may be powered by intermittent sources. The intermittent source feeds an input rail $V_{IN}$. A power management circuit converts $V_{IN}$ into a useful stable internal rail voltage $V_{DD}$ for the sensor sub-systems. The power management circuit requires power for its own internal control circuits, which is supplied from the $V_{DD}$ rail. In order to stop this quiescent power from unnecessarily draining power from the $V_{DD}$ rail, the power management is powered off during input power lulls. A voltage detector, the device under consideration here, senses the input voltage $V_{IN}$, and power-gates the power management circuit via a PMOS transistor, which is switched by the voltage detector's open-drain output $\overline{Enable}$. Three-terminal voltage detectors are used that do not require connection to a supply rail, and therefore, in principle provide always-awake input monitoring, even when the rest of the sensor system is powered off.

Alternatively, as shown in FIG. 1, the voltage detector could be used to switch on a power supply, for example from a battery, thus minimising use of stored power to when there is a detection signal.

In practice, however, existing commercially-available voltage detectors have a significant input quiescent current, especially once activated. This quiescent current significantly reduces the source's output voltage, and thus prevents the use of wireless rectifying antennas (rectennas) with multiple voltage multiplying stages, and wearable energy harvesters such as ferroelectret textiles, because these have high source impedances of up to tens of MΩ. For these sources, input monitoring and input-dependent power gating is therefore not currently possible.

This problem is illustrated in FIG. 2, which shows the operation of a commercially available voltage detector being used in the circuit of FIG. 1. FIG. 2 shows the source voltage $V_{IN}$ when the source is unloaded (dashed line), and also when loaded by the voltage detector (solid line). On reaching the detector's threshold, the quiescent current $I_{IN}$ increases sharply, dragging the input voltage down, thus switching the detector off again. The quiescent input current drops and the process begins again, resulting in a pulsing output $V_{OD}$ rather than an output pulse that lasts the duration of the incoming power, as required for the power-gating of sensor sub-systems. More importantly, the source voltage $V_{IN}$ has been affected in such a way that the supply to the power management circuit shown in FIG. 1 is significantly reduced.

Another potential solution is the Power-On-Reset circuit (POR), which monitors an input without the need for a stable voltage rail. FIG. 3 illustrates the operation of a basic POR pulse generator circuit. However, the output is a short reset-pulse, which does not provide information on the duration of the incoming source power.

FIG. 4 shows the desired behaviour of an ideal voltage detector, where the incoming voltage is preserved, the quiescent current is zero most of the time, and the output lasts the duration of the incoming power.

Many different types of low-power integrated circuits for monitoring voltage rails have been proposed, including those previously referred to. In one such circuit (as described in "A 330 nA energy-harvesting charger with battery management for solar and thermoelectric energy harvesting" by K. Kadivrl et al) a voltage detector consists of a comparator and a band-gap reference to determine the input condition. However, the quiescent current of this circuit is 180 nA, mostly due to continuous flow of bias current through reference-voltage generating circuitry and the comparator. The voltage detection threshold of this circuit is 2.1V and the maximum operating voltage is 4V. Additional protection circuits could be used to protect the circuit from potentially damaging over voltage conditions, but by clamping the input voltage at 4V, a significant percentage of the source power would be lost.

A monitoring circuit consuming sub-nA current has also been proposed (Toshishige Shimamura, Mamoru Ugajin, Kenji Suzuki, Kazuyoshi Ono, Norio Sato, Kei Kuwabara, Hiroki Morimura, Shin'ichiro Mutoh: "Nano-Watt Power Management and Vibration Sensing on a Dust-Size Battery-less Sensor Node for Ambient Intelligence"). It operates without the need for a bandgap voltage reference for low power, but triggers only at a high input voltage.

Detectors which do not need comparators have been proposed, (e.g. by P. Chen, et al: "Startup Techniques for 95 mV Step-Up Converter by Capacitor Pass-On Scheme and $V_{TH}$-Tuned Oscillator with Fixed Charge Programming" and X. Zhang et al: "A 0.6 V Input CCM/DCM Operating Digital Buck Converter in 40 nm CMOS"). Their quiescent current is therefore reduced to few nA. The technology used permits detection thresholds of a few hundred mV, but this also reduces the maximum allowed input voltage.

In "Design and Realization of a Voltage Detector Based on Current Comparison in a 40 nm Technology" by S. Y. Wu, W. B. Chen, N. Ning, J. Li, Y. Liu, and Q. Yu, a current comparison voltage detector is reported, which uses current comparison instead of a voltage comparator. The current reference is programmed by a logic control circuit, and provides the detector with three selectable thresholds. The power, however, is high at μW and the voltage detection threshold is 1.1V.

A battery supervisor circuit consuming 635 pW at 3.6 V is reported in "A 635 pW Battery Voltage Supervisory Circuit for Miniature Sensor Nodes" by I. Lee, S. Bang, Y.

Lee, Y. Kim, G. Kim, D. Sylvester, and D. Blaauw. This circuit achieves low power consumption through a 57 pA voltage reference and a low power comparator. The detection threshold, however, is 3.6 V, which is too high for many applications. In "248 pW, 0.11 mV/° C. Glitch-Free Programmable Voltage Detector With Multiple Voltage Duplicator for Energy Harvesting" by Teruki Somey, Hiroshi Fuketa, Kenichi Matsunaga, Hiroki Morimura, Takayasu Sakurai, and Makoto Takamiya, a 248 pW voltage detector for energy harvesting is demonstrated. However, its maximum input voltage is 0.1 V, which is too low for many applications.

As will be appreciated from the discussion above, existing commercial discrete voltage detectors and integrated detection circuits are unsuitable for the continuous, non-invasive monitoring of high-impedance source voltages. A need therefore exists for a voltage detector which combines a high (greater than 10V) maximum input voltage, a low (lower than 1V) detection threshold and a low (lower than 248 pW) quiescent power consumption.

It is an object of embodiments of the present invention to provide a voltage detector and a voltage detector system that address the problems of the prior art.

SUMMARY OF INVENTION

According to a first aspect of the invention there is provided a voltage detector comprising: a first voltage reference generator for generating a first voltage reference signal; a second voltage reference generator for generating a second voltage reference signal, wherein the second voltage reference signal is higher than the first voltage reference signal; a trigger, powered by an input signal to the voltage detector, and having an input for receiving either the first or second voltage reference signal and an output for generating a detection signal; and a switch for selectively connecting the input of the trigger to the first or second voltage reference signal, wherein: the switch is operative to connect the input of the trigger to the first voltage reference signal when the detection signal output by the voltage detector is low and is operative to connect the input of the trigger to the second voltage reference signal when the detection signal output by the voltage detector is high.

The first and second voltage reference generators of the voltage detector may each comprise a first transistor and a second transistor connected in series between the input signal and a common reference, wherein the first transistor has a different gate threshold than the second transistor.

The trigger may comprise a PMOS transistor and an NMOS transistor connected so as to form an inverter.

The first and second reference voltage signals produced by the first and second voltage reference circuits may be low enough to ensure that the inverter is in subthreshold mode when it switches.

The common reference may be ground.

The voltage detector may further comprise a third voltage reference generator for generating a third voltage reference signal, wherein the third voltage reference generator is configured to output the third voltage reference signal to the first and second voltage reference generators.

According to a second aspect of the invention there is provided a voltage detector system for monitoring an input signal and outputting a detection signal when the voltage of the input signal meets a threshold, the voltage detector system comprising: a first voltage detector having an input for receiving the input signal and an output for outputting a detection signal, wherein the first voltage detector is configured to output the detection signal when the voltage of the input signal meets a first rising input voltage threshold; a second voltage detector having an input for receiving the input signal and an output for outputting a detection signal, wherein the second voltage detector is configured to output the detection signal when the voltage of the input signal meets a second rising input voltage threshold which is higher than the first threshold, wherein the first and/or second voltage detector is according to the first aspect of the invention, and the output of the second voltage detector controls a connection between the input signal and the input of the first voltage detector such that when the voltage of the input signal meets the second rising input voltage threshold the connection between the input signal and the input of the first voltage detector is restricted or disconnected.

The voltage detector system may further comprise: a third voltage detector having an input for receiving the input signal and an output for outputting a detection signal, wherein the third voltage detector is configured to output a detection signal when the voltage of the input signal meets a third rising input voltage threshold which is higher than both the first threshold and the second threshold, wherein the output of the third voltage detector controls a connection between the input signal and the input of the second voltage detector such that when the voltage of the input signal meets the third rising input voltage threshold the connection between the input signal and the input of the second voltage detector is restricted or disconnected.

The third voltage detector may be according to the first aspect of the invention.

The first voltage detector may be configured to cease outputting a detection signal when the voltage of the input signal meets a first falling input voltage threshold, wherein the first falling input voltage threshold is lower than the first rising input voltage threshold.

The second voltage detector may be configured to cease outputting a detection signal when the voltage of the input signal meets a second falling input voltage threshold, wherein the second falling input voltage threshold is lower than the second rising input voltage threshold.

The third voltage detector may be configured to cease outputting a detection signal when the voltage of the input signal meets a third falling input voltage threshold, wherein the third falling input voltage threshold is lower than the third rising input voltage threshold.

The voltage detection system may further comprise an open drain output stage, the output stage comprising a plurality of MOSFET devices, each MOSFET device having: a gate terminal connected to an output of a respective one of the voltage detectors; a source terminal connected to the common reference; and a drain terminal connected to an output terminal of the output stage.

A gate threshold of each MOSFET device may be lower than the rising input threshold and the falling input threshold of the respective voltage detector to which the MOSFET device is connected.

BRIEF DESCRIPTION OF THE DRAWINGS

Embodiments of the invention will now be described, strictly by way of example only, with reference to the accompanying drawings, of which.

DESCRIPTION OF THE EMBODIMENTS

Figure 1:
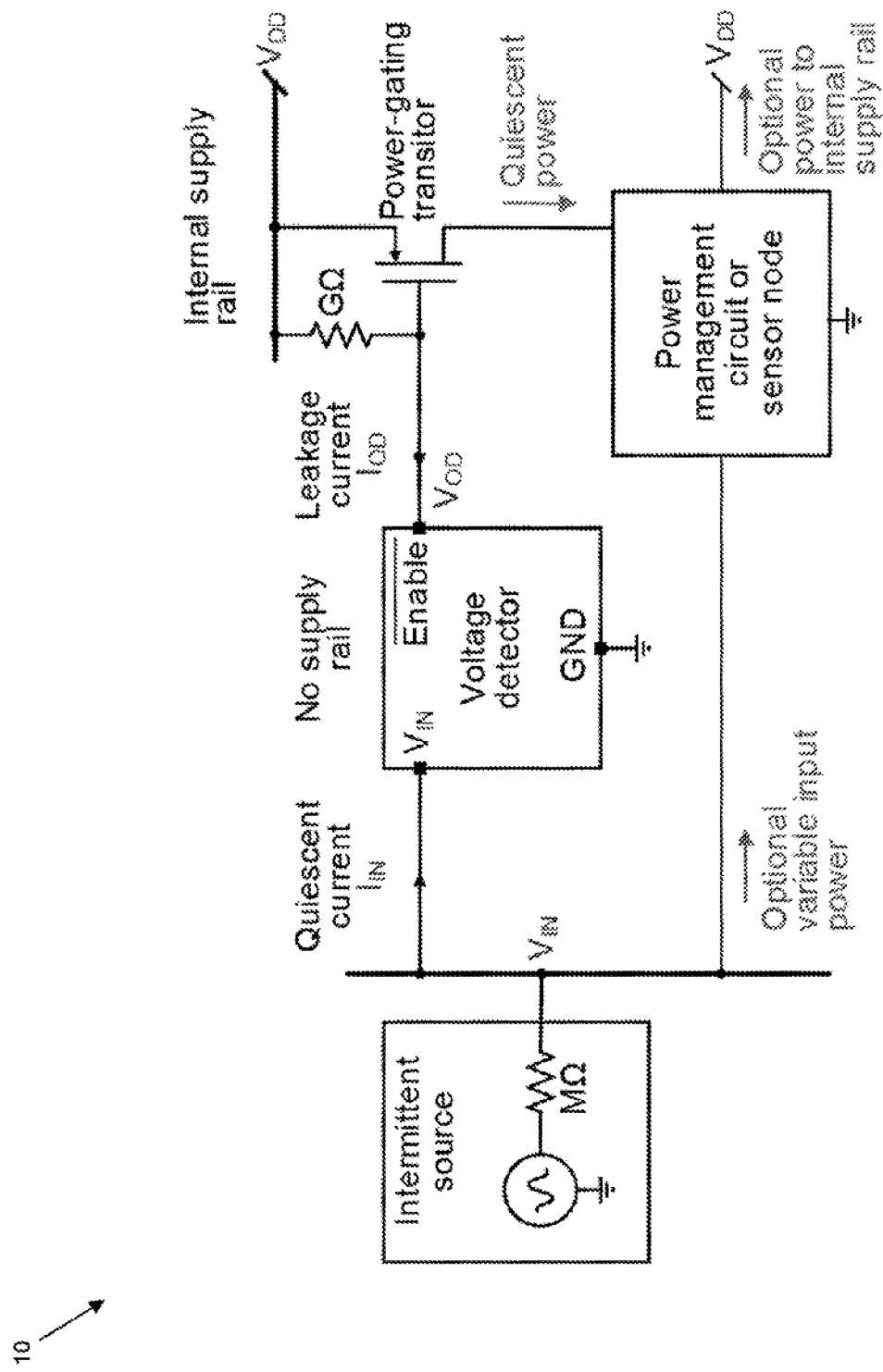
FIG. 1 is a schematic representation of a sensor system that is powered by intermittent sources.
Figure 2:
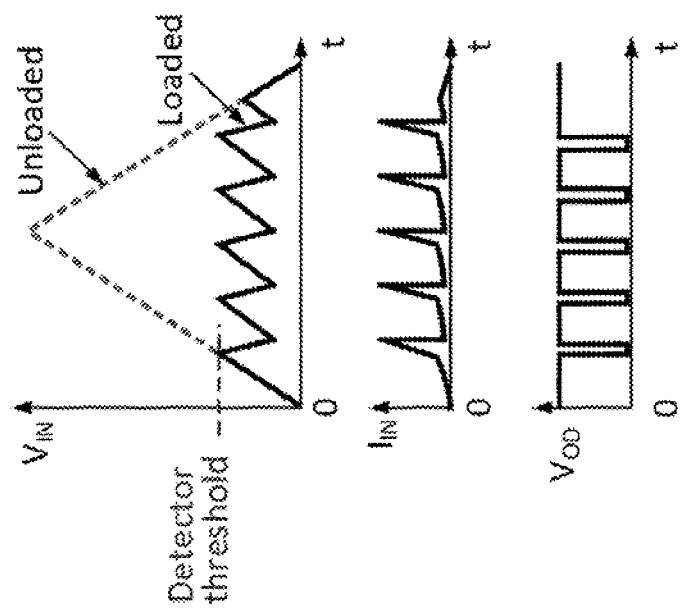
FIG. 2 illustrates the operation of a commercially available voltage detector as used in the circuit of FIG. 1.
Figure 3:
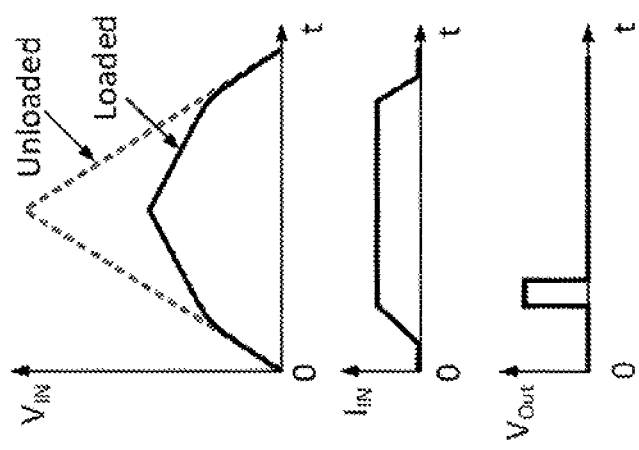
FIG. 3 illustrates the operation of a basic power on reset (POR) pulse generator circuit.
Figure 4:
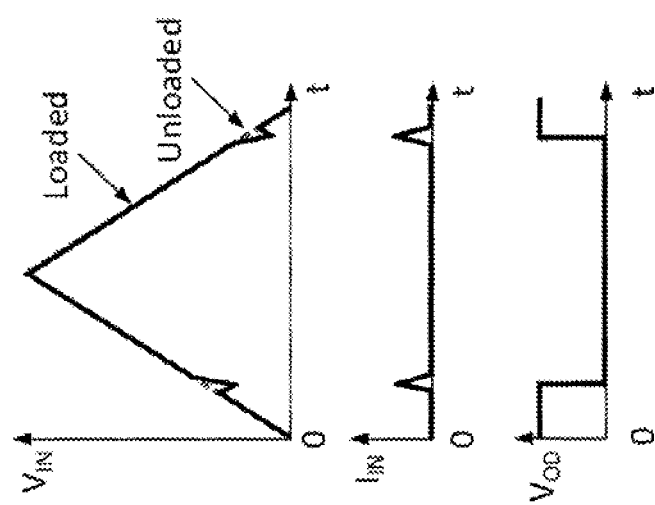
FIG. 4 illustrates the ideal behaviour of a POR circuit.
Figure 5:
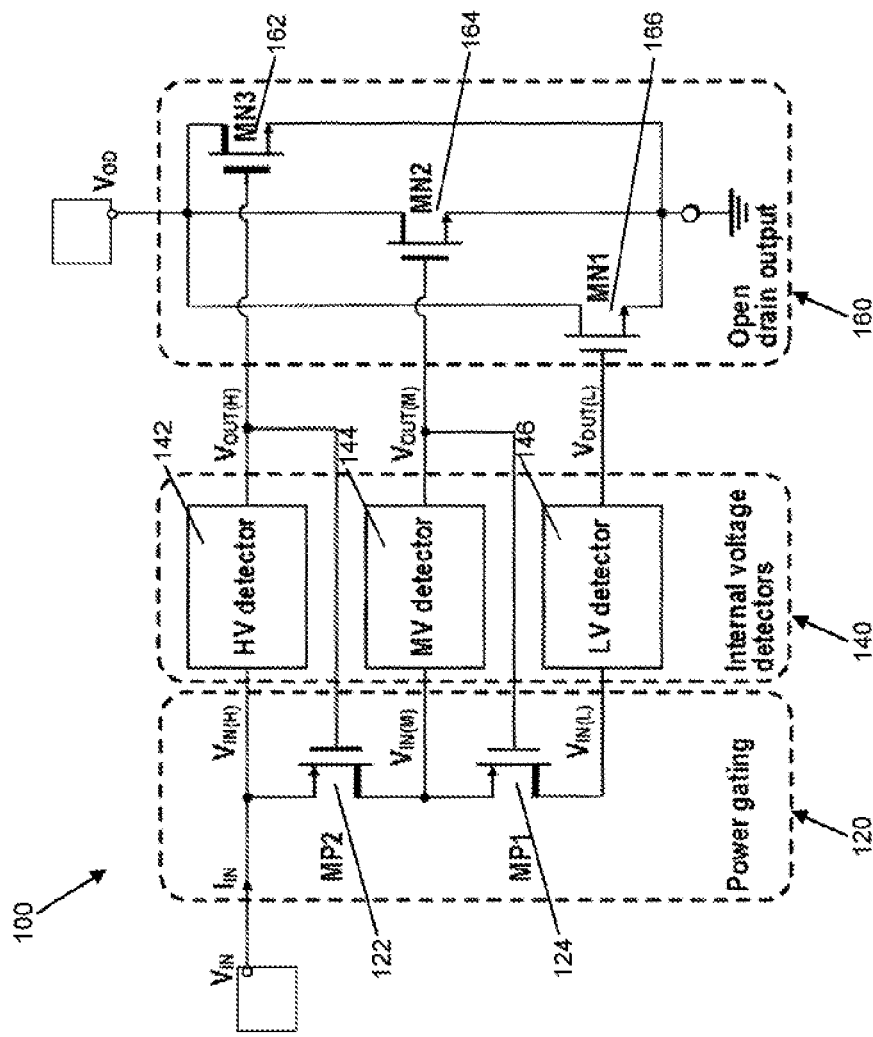
FIG. 5 is a schematic representation of a system architecture of a system incorporating a plurality of voltage detectors.

FIG. 5 illustrates a voltage detection system which combines all the desired properties of voltage detectors, namely high maximum input voltage, a low voltage detection threshold and low quiescent power consumption. The system, shown generally at 100 in FIG. 1, includes a power gating stage 120, a voltage detection stage 140 and an output stage 160.

The voltage detection stage 140 includes a first voltage detector 142 which is configured to detect input voltages in a high voltage range (e.g. in the range 2.8 volts to 20 volts), a second voltage detector 144 which is configured to detect input voltages in a medium voltage range (e.g. 0.6 volts to 2.8 volts) and a third voltage detector 146 which is configured to detect input voltages in a low voltage range (e.g. 0.45 volts to 0.6 volts). This arrangement of three voltage detectors ensures that the voltage detection system 100 is able to operate in a wide input voltage range, therefore facilitating the capture of energy from pulses with a wide power range.

The power gating stage 120 is configured to prevent potentially damaging input voltages from reaching the second and third voltage detectors 144, 146, and is arranged such that the first voltage detector 142 gates the second and third voltage detectors 144, 146 and the second voltage detector 144 gates the third voltage detector 146. As can be seen in FIG. 5, the voltage input $V_{IN}$ of the system 100 is connected to an input $V_{IN(H)}$ of the first voltage detector 142. An output $V_{OUT(H)}$ of the first voltage detector 142 is connected to the gate terminal of a first P-channel MOSFET 122. The source terminal of the first P-channel MOSFET is connected to the voltage input $V_{IN}$ and the drain terminal of the first P-channel MOSFET 122 is connected to an input $V_{IN(M)}$ of the second voltage detector 144, and, via a second P-channel MOSFET 124, to an input $V_{IN(L)}$ of the third voltage detector 146.

When the first voltage detector 142 detects an input voltage in the high voltage range, its output $V_{OUT(H)}$ goes high, causing the first P-channel MOSFET 122 to switch off, thereby restricting or preventing the input voltage from reaching the second voltage detector 144 or the third voltage detector 146.

Similarly, the gate terminal of the second P-channel MOSFET 124 is connected to an output $V_{OUT(m)}$ of the second voltage detector 144, such that when the second voltage detector 144 detects an input voltage in the medium voltage range, its output $V_{OUT(M)}$ goes high, causing the second P-channel MOSFET 124 to switch off, thereby restricting or preventing the input voltage from reaching the third voltage detector 146.

The output stage 160 of the voltage detection system 100 includes (in the illustrated example) first, second and third N-channel MOSFETS 162, 164, 166. The gate terminal of the first N-channel MOSFET 162 is connected to the output $V_{OUT(H)}$ of the first voltage detector 142, whilst the gate terminal of the second N-channel MOSFET 164 is connected to the output $V_{OUT(M)}$ of the second voltage detector 144 and the output of the third N-channel MOSFET 166 is connected to the output $V_{OUT(L)}$ of the third voltage detector 146. The drain terminals of the first, second and third N-channel MOSFETs 162, 164, 166 are all connected to an open-drain output terminal $V_{OD}$ of the output stage 160, whilst the source terminals of the first, second and third N-channel MOSFETs 162, 164, 166 are all connected to ground. Accordingly, if any one of the first, second or third voltage detectors 142, 144, 146 is triggered, the open drain output $V_{OD}$ of the output stage 160 will be activated.

Figure 6:
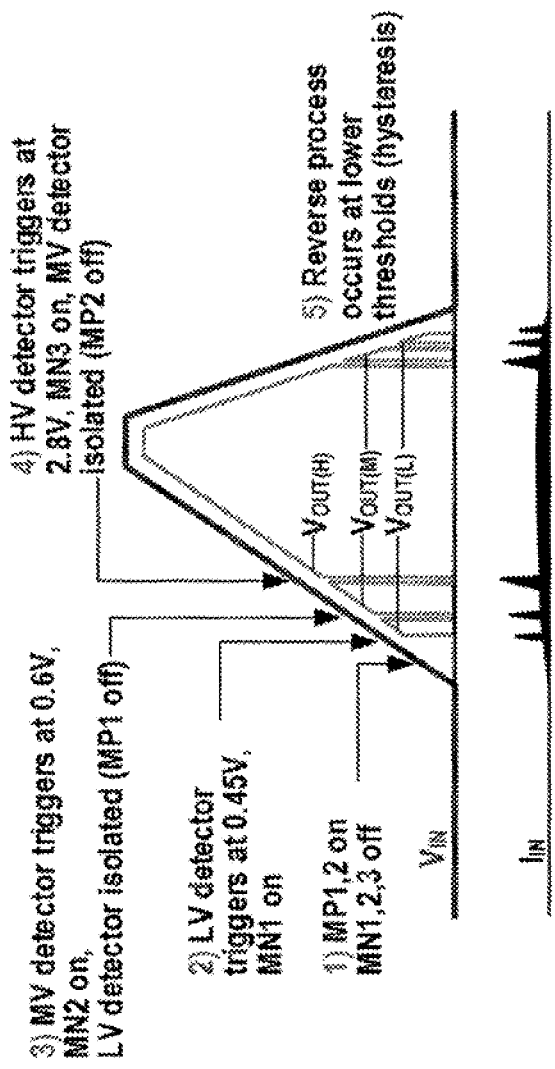
FIG. 6 is a timing diagram illustrating the operation of the system of FIG. 5.

FIG. 6 is a timing diagram illustrating the operation of the circuit of FIG. 5. The input voltage $V_{IN}$ is shown as a trapezoidal pulse. As the rising edge of this pulse reaches the voltage detection threshold of the third (low voltage range) voltage detector 146, the third voltage detector 146 turns the third N-channel MOSFET 166 on, activating the system's output $V_{OD}$. When the input voltage $V_{IN}$ reaches the voltage detection threshold of the second (medium voltage range) voltage detector 144, the second voltage detector 144 switches on the second N-channel MOSFET 164, and power-gates off the third voltage detector 146, thus protecting it from a further rise in $V_{IN}$, and causing the third N-channel MOSFET 166 to be switched off. As $V_{IN}$ reaches the voltage detection threshold of the first (high voltage range) voltage detector 142, the first N-channel MOSFET 162 is switched on, and both the second and third voltage detectors 144, 146 are disconnected from the input (or at least the connection restricted), resulting in the turning off of the second N-channel MOSFET 164. The first voltage detector 142 remains active until the input voltage drops below its voltage detection threshold, which leads to the second voltage detector 144 being powered on. A further fall in the input voltage activates the third voltage detector 146.

The thresholds at which the voltage detectors 142, 144, 146 switch on in response to a rising input voltage may be different from (higher than) the thresholds at which the voltage detectors 142, 144, 146 switch off in response to a falling input voltage, in order to provide hysteresis and thus avoid system oscillation. The overall result is a continuous activation of the open-drain output $V_{OD}$ for the duration of the input pulse. To ensure seamless operation of the voltage detection system 100, the threshold voltage of each MOSFET device 162, 164, 166 should be lower than the detection thresholds at which the respective voltage detectors 142, 144, 146 switch on in response to a rising input voltage and the thresholds at which the respective voltage detectors 142, 144, 146 switch off in response to a falling input voltage.

This illustrates the reason for using an open-drain output. When activated, the voltage outputs $V_{OUT(H)}$, $V_{OUT(M)}$ and $V_{OUT(L)}$ of the voltage detectors 142, 144, 146 are at the same potential as their corresponding inputs $V_{IN(H)}$, $V_{IN(M)}$ and $V_{IN(L)}$. Since the voltage detector system 100 will interface to other CMOS devices with much lower maximum allowable voltages, $V_{OUT(H)}$ and $V_{OUT(M)}$ cannot be used as the output of the overall system. The open drain output stage allows the voltage detector system 100 to output a signal that is usable by, and not damaging to, an external device.

FIG. 6 also illustrates the profile of the total quiescent current $I_{IN}$ of the voltage detector system 100. $I_{IN}$ is zero when the input voltage $V_{IN}$ is zero, and on a rising input voltage the current increases from 42 pA at 0.2V (below the voltage detection threshold of the third voltage detector 146) to 83 pA at $V_{IN}$=1 V (above the detection threshold of the second voltage detector 144), and to around 236 pA at $V_{IN}$=5V (above the detection threshold of the first voltage detector 142), with current surges occurring at the activation points of each of the three voltage detectors 142, 144, 146. The measured total energy loss per transition caused by static current when an input voltage rises from 0 to 2.8V, a voltage slightly higher than the high detection threshold (2.8V) with two typical gradients of 1V/s and 100V/s respectively are 788 pJ and 7.9 pJ respectively. This is lower than prior art voltage detection circuits, which contain circuits that, for a given rail voltage, continuously consume quiescent current. An alternative version of the voltage detector system 100 in which the third voltage detector 144 is disabled draws 1.2 pA at 0.2V, around 6 pA at 1V and 111 pA at 5V. Its total energy consumption at 1V/s and 100V/s transition from 0 to 2.8V of the input voltage is 229 pJ and 23 pJ respectively.

Figure 7:
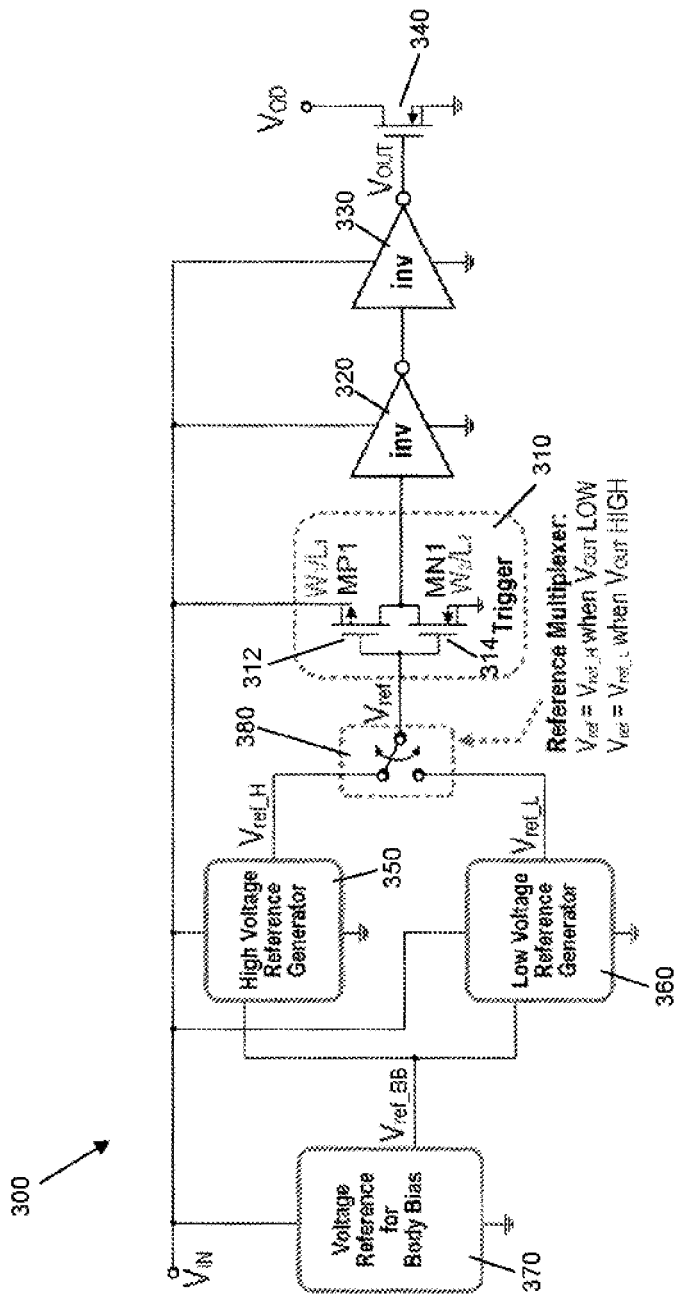
FIG. 7 is a schematic representation of a voltage detector for use in the system of FIG. 5.

FIG. 7 is a schematic diagram illustrating a voltage detector for use in the voltage detector system 100 shown in FIG. 5, to form the first, second and/or third voltage detector 142, 144, 146 used in the voltage detector system 100.

The voltage detector, shown generally at 300 in FIG. 7, provides a programmable trigger threshold that is not fixed by the process technology chosen. The detection threshold and hysteresis can be set, at the time of circuit design, to a desired value. This is desirable for under-voltage-lockout circuits that activate other circuits in a specific input voltage band.

The voltage detector 300 has a trigger stage 310 which is powered by the input signal $V_{IN}$. The trigger stage 310 comprises an inverter formed by a transistor pair consisting of a PMOS transistor 312 (labelled MP1 in FIG. 7) and an NMOS transistor 314 (labelled MN1 in FIG. 7), followed by two inverter buffer stages 320, 330, which drive an open-drain output switch 340. The voltage detector 300 also includes a first ultra-low-power voltage reference circuit 350 and a second ultra-low-power voltage reference circuit 360, which generate, respectively, a fixed higher reference voltage $V_{ref\_H}$ and a lower voltage $V_{ref\_L}$. The body terminal voltages $V_{ref\_BB}$ of the first and second ultra-low-power voltage reference circuits 350, 360 are shown in FIG. 7 to be controlled by another voltage reference. This other voltage reference may be, for example, a further reference generator block 370 with output $V_{ref\_BB}$. Alternatively, two reference generator blocks could be provided, one for each of the first and second ultra-low-power voltage reference circuits 350, 360. As a further alternative, the $V_{ref\_BB}$ inputs to the high and low voltage reference blocks could be provided by nodes internal to these blocks themselves (self-biased blocks). The self-biased version will now be discussed.

Depending on the rise and fall of the input voltage YIN, $V_{ref\_H}$ and $V_{ref\_L}$ are multiplexed by a switch 380 to a single reference input $V_{ref}$ to the gate of the trigger stage 310. As shown in FIG. 7, when the output signal $V_{OUT}$ of the voltage detector 300 is low, the switch 380 connects the output of the first ultra-low-power voltage reference circuit 350 (i.e. the higher reference voltage $V_{ref\_H}$) to the input of the trigger stage 310, whilst when the output signal $V_{OUT}$ of the voltage detector 300 is high, the switch 380 connects the output of the second ultra-low-power voltage reference circuit 360 (i.e. the lower reference voltage $V_{ref\_L}$) to the input of the trigger stage 310.

The two reference voltages $V_{ref\_H}$ and $V_{ref\_L}$, along with the relative sizing of the PMOS and NMOS transistors 312, 314 which make up the trigger stage 310, determine the different rise and fall detection thresholds ($V_{th\_rise}$ and $V_{th\_fall}$) of the voltage detector 300, to provide detection hysteresis. The detection (trigger) thresholds are determined by equating the current $I_{trigger}$ through the PMOS transistor 312 and through the NMOS transistor 314, when the input $V_{IN}$ rises to $V_{th\_rise}$ and falls to $V_{th\_fall}$ (given that the two transistors 312 and 314 operate in subthreshold and in saturation):

$$I_{trigger(rise)} = K_p(n-1)V_T^2 \exp\left(\frac{V_{th\_rise}-V_{ref\_H}-|V_{THp}|}{nV_T}\right) = \quad \text{Equation (1)}$$
$$K_n(n-1)V_T^2 \exp\left(\frac{V_{ref\_H}-V_{THn}}{nV_T}\right)$$

$$I_{trigger(fall)} = K_p(n-1)V_T^2 \exp\left(\frac{V_{th\_fall}-V_{ref\_L}-|V_{THp}|}{nV_T}\right) = \quad \text{Equation (2)}$$
$$K_n(n-1)V_T^2 \exp\left(\frac{V_{ref\_L}-V_{THn}}{nV_T}\right)$$

where $V_{THp}$ and $V_{THn}$ are respectively the gate thresholds of the PMOS transistor 312 and the NMOS transistor 314 of the trigger 310 in FIG. 7. $K_p=\mu_p C_{ox}\cdot(W_1/L_1)$ and $K_n=\mu_n C_{ox}\cdot(W_2/L_2)$ are their gain factors ($\mu$ is mobility, $C_{ox}$ is gate oxide capacitance per unit area, and W is transistor width and L is transistor length); n is the subthreshold slope factor (n=1+ $C_d/C_{ox}$ where $C_d$ is depletion capacitance, and assuming the n difference between PMOS and NMOS is small); $V_T$ is thermal voltage ($\approx$26 mV). The detection hysteresis is $V_{th\_rise}-V_{th\_fall}=2\times(V_{ref\_H}-V_{ref\_L})$.

From (1) and (2), analytical solutions for $V_{th\_rise}$ and $V_{th\_fall}$ are $$V_{th\_rise}=(|V_{THp}|-V_{THn})-n\cdot V_T \ln(K_p/K_n)+2V_{ref\_H} \quad \text{Equation (3)}$$

$$V_{th\_fall}=(|V_{THp}|-V_{THn})-n\cdot V_T \ln(K_p/K_n)+2V_{ref\_L} \quad \text{Equation (4)}$$

By selecting width (W) and length (L) of the PMOS transistor 312 and the NMOS transistor 314 appropriately, the first and second terms in (3) and (4) can be set to cancel out and achieve $V_{th\_rise}=2V_{ref\_H}$ and $V_{th\_rise}=2V_{ref\_L}$. Therefore, controlling the detector thresholds and hysteresis only requires the changing of the two reference voltages $V_{ref\_H}$ and $V_{ref\_L}$.

Figure 8:
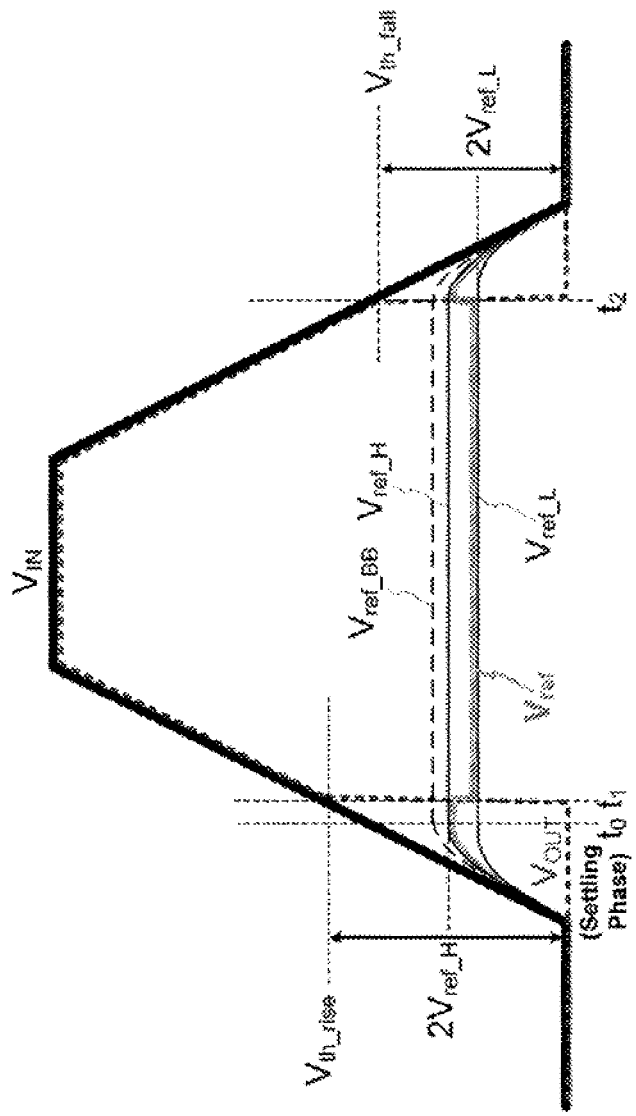
FIG. 8 is a timing diagram illustrating the operation of the voltage detector of FIG. 6.

The operation of the voltage detector 300 is illustrated in FIG. 8. Initially, the two reference voltages $V_{ref\_H}$ and $V_{ref\_L}$ and the output $V_{ref\_BB}$ of a third reference generator (which, as explained above, may be the further reference generator block 370) rise as $V_{IN}$ increases, and then settle to three different steady-state levels.

During the settling time (t0), $V_{OUT}$ stays low so that $V_{ref}$ follows $V_{ref\_H}$ via the multiplexer 380. When $V_{IN}$ rises to $V_{th\_rise}$ (=$2V_{ref\_H}$) at $t_1$, the PMOS transistor 312 is turned on, and $V_{OUT}$ is thus pulled up to $V_{IN}$. Meanwhile, the multiplexer 380 switches $V_{ref}$ from $V_{ref\_H}$ to $V_{ref\_L}$ until $V_{IN}$ drops to $V_{th\_fall}$ (=$2V_{ref\_L}$). Then $V_{OUT}$ goes low and $V_{ref}$ switches back to $V_{ref\_H}$ for the next incoming input pulse.

Figure 9:
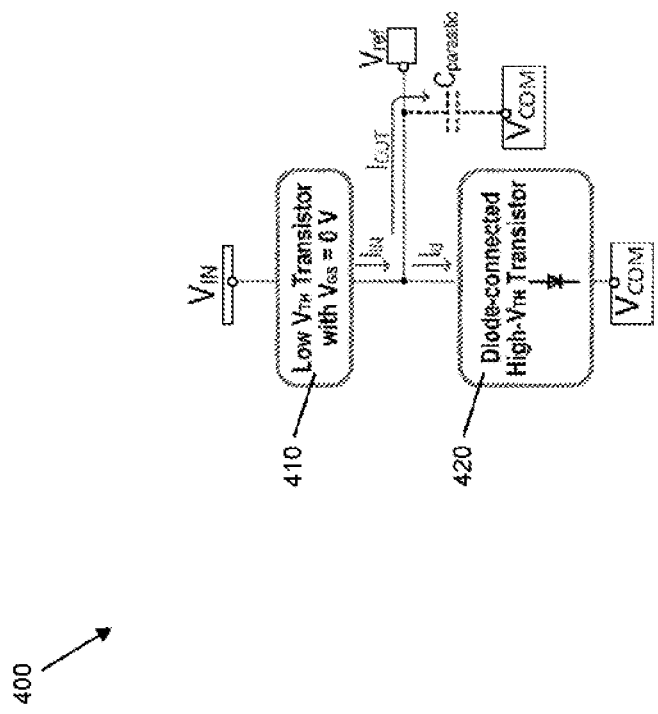
FIG. 9 is a schematic representation of a circuit for implementing voltage reference circuits in the voltage detector circuit of FIG. 6.

FIG. 9 is a schematic representation of a circuit for implementing the first and second voltage reference circuits 350, 360 of FIG. 8. The circuit, shown generally at 400 consists of two stacked transistors 410, 420 with different gate thresholds $V_{TH}$. A first one 410 of the stacked transistors has a lower $V_{TH}$ and zero gate-source voltage, whilst a second one 420 of the stacked transistors has higher $V_{TH}$ and is configured as a diode-connected transistor. At steady-state the circuit consumes only pico-amperes of current.

A shortcoming of the circuit 400 is that it is relatively slow to reach a steady-state output during a rising input voltage $V_{IN}$. For fast rises of $V_{IN}$, this leads to the reference voltages not having been established by the time the input voltage reaches the desired detection threshold voltage. The circuit 400 therefore triggers too soon. The reason for the long start-up time is the circuit's extremely low current that is charging parasitic capacitors.

It is possible to increase the speed with which the circuit 400 reaches a steady state output. This involves increasing the current through the low $V_{TH}$ transistor 410 relative to that flowing in the high $V_{TH}$ transistor 420 of FIG. 9. The difference in the currents, the output current (shown as LOUT in FIG. 9), determines how fast the output parasitic capacitor is charged. However, this is done by changing transistor sizes, which, in turn, changes the output parasitic capacitance (affecting the start-up) and generated reference voltage. This makes it very difficult to achieve both desired fast start-up and reference voltages at the same time.

It is possible largely to decouple the setting of reference voltages and speed-up of the reference voltage generators 350, 360, and this leads to a wider allowable range of input voltage gradients.

Figure 10:
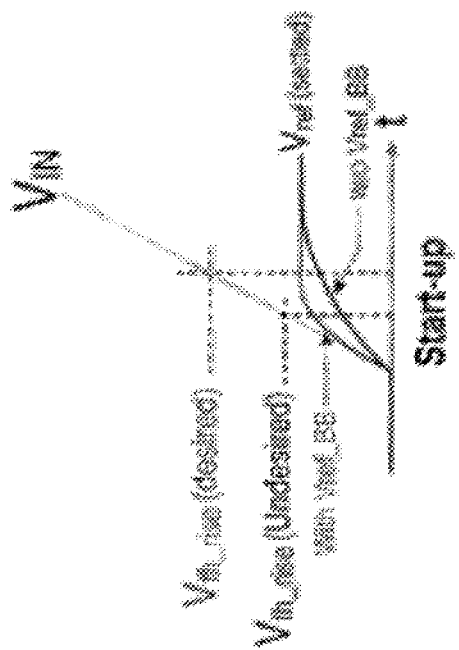
FIG. 10 is a graph illustrating start-up behaviour of the circuit of FIG. 6.

Returning to FIG. 15, consider the system 300 the reference generator 370, which provides a reference output $V_{ref\_BB}$, which sets the body bias of the low $V_{TH}$ transistor 410. The reference generator 370 speeds up the reference generation, as illustrated in the graph of FIG. 10, thus setting up the detection threshold sooner and allowing higher input voltage gradients.

Figure 11:
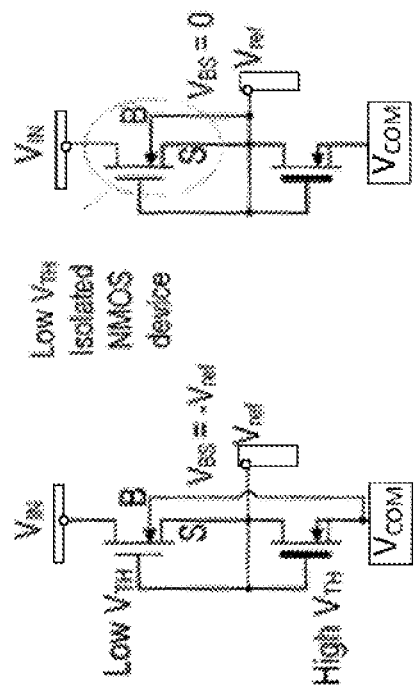
FIG. 11 is a schematic representation of conventional low power body biasing schemes.

This requires a body-biasing method. Again, commonly-used bandgap reference circuits use too much power. Known lower power body bias schemes are shown in FIG. 11. For standard CMOS process technology, the body terminal ('B') of NMOS transistors is connected to the lowest potential in the circuits, e.g. $V_{COM}$, a common reference (which may be ground), as shown in the left-hand circuit of FIG. 11. This results in a negative body-source voltage i.e. $V_{BS}$=−$V_{ref}$, which strongly constrains the current level through the low-$V_{TB}$ transistor and hence that charging the output parasitic capacitor. Flexibility is provided in isolated CMOS process technology, which allows shorting body and source terminals, as shown in the right-hand circuit of FIG. 11.

Figure 12:
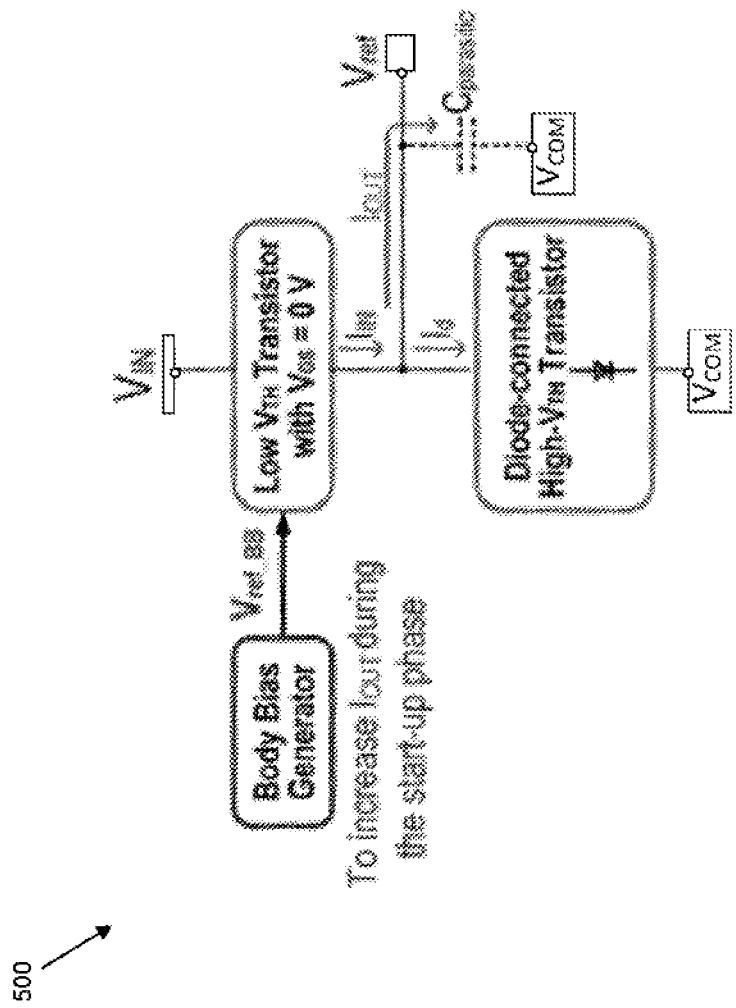
FIG. 12 is a schematic representation of the circuit of FIG. 9, with an additional body-bias generator.
Figure 13:
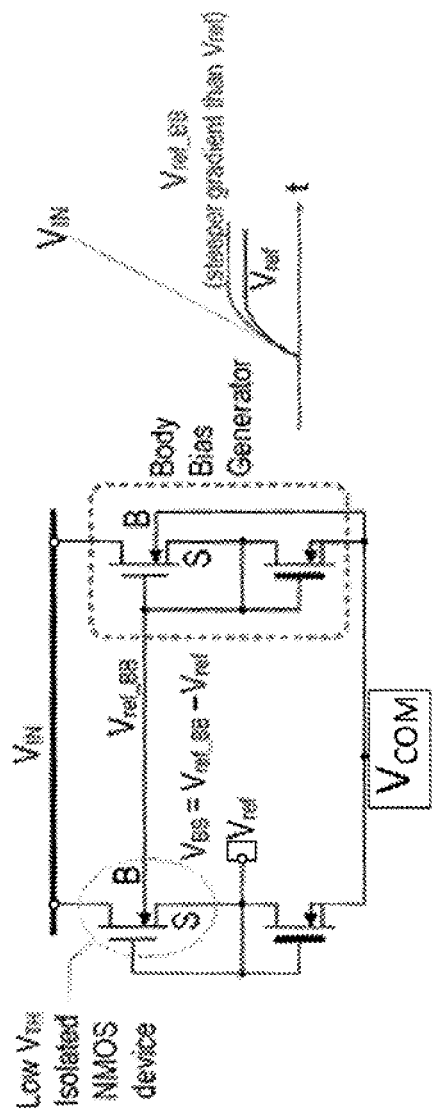
FIG. 13 is a schematic diagram showing a body-bias circuit.

FIG. 12 is a schematic representation of the circuit of FIG. 9, with an additional body-bias generator, whilst FIG. 13 is a schematic diagram showing a body-bias circuit 500 which introduces an additional body-bias generator.

The body-bias circuit 500 of FIG. 13 sets the parameter $V_{ref\_BB}$ to be higher than $V_{ref}$ so that $V_{BS}$ becomes positive. This further increases the charging current and makes the current controllable, which in turn speeds up the start-up. The $V_{ref\_BB}$ value can be customised for different $V_{IN}$ gradients to ensure that $V_{ref}$ has settled before $V_{IN}$ reaches the desired detection threshold. For instance, setting a higher $V_{ref\_BB}$ allows for a steeper $V_{IN}$ gradient.

The transistor sizes of the body-bias generator should be chosen in such a way that $V_{ref\_BB}$ has a steeper gradient than $V_{ref}$ when $V_{IN}$ rises. This ensures a positive body-source voltage during the start-up.

Figure 14:
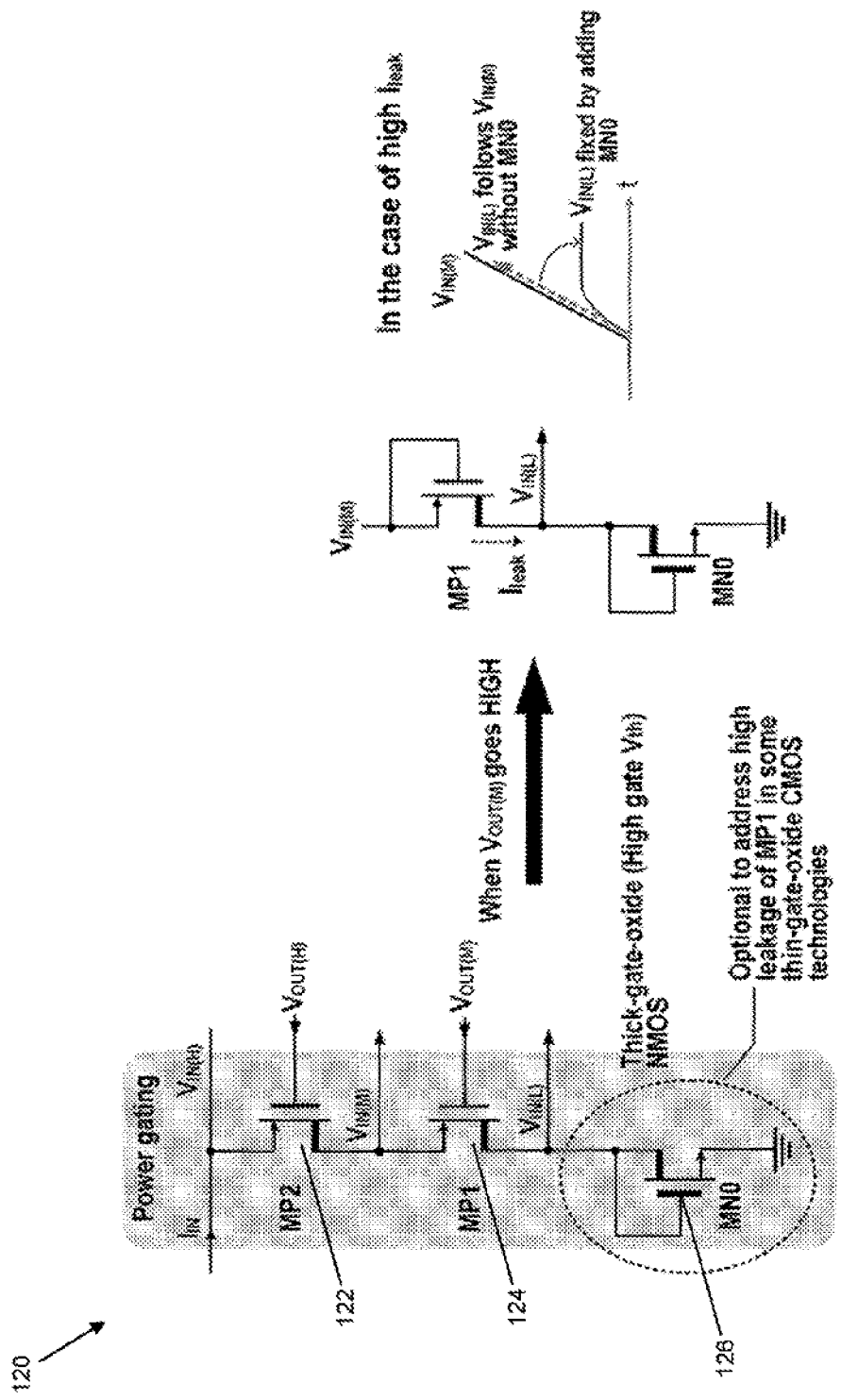
FIG. 14 is a schematic representation of a power-gating circuit suitable for use in the architecture of FIG. 5.

FIG. 14 is a schematic representation of a power-gating circuit 120 suitable for use in the voltage detection system 100 of FIG. 5. The power-gating transistor 122 (labelled MP2 in FIGS. 5 and 22) should be a medium-gate-oxide (5.5 V breakdown) PMOS transistor because its source-gate voltage can be as high as 2.8 V (corresponding to the threshold of the first voltage detector 142) before its gate-drive signal goes high. By contrast, the power-gating transistor 124 (labelled MP1 in FIGS. 5 and 22) can be a thin-gate-oxide PMOS transistor because its source-gate voltage does not exceed 0.6 V (corresponding to the threshold of the second voltage detector 144) and its low gate-threshold voltage helps the third (low voltage range) detector 146 start to operate at a low input voltage.

Ideally, the input voltage $V_{IN(L)}$ of the third detector 146 will drop after the transistor 122 (MP2) is switched off for protecting this detector. However, in some thin-gate-oxide CMOS process technologies, the leakage current through the transistor 124 (MP1) (when 'OFF') can be sufficiently high so that $V_{IN(L)}$ can continue to rise and follow the input voltage $V_{IN(M)}$ of the second (medium voltage range) detector 144. This may cause overvoltage damage to the third detector 146 especially when $V_{IN(M)}$ has a slow voltage gradient. A simple but efficient protection solution is to add a route to ground (or a common reference) for the leakage current. In the power gating circuit 120 of FIG. 14, this is implemented with a diode-connected NMOS transistor 126 (labelled MN0), which is a thick-gate-oxide (high gate-threshold) transistor. When the second voltage detector 144 output $V_{OUT(M)}$ goes high, which switches off the transistor 124 (MP1) (zero gate-source voltage), the two transistors 124 (MP1) and 126 (MN0) are configured as the ultra-low-power two-transistor voltage reference illustrated in FIG. 9. The reference circuit clamps $V_{IN(L)}$ to a fixed voltage while consuming pico-amperes current only, and by adjusting the W/L ratios of transistors 124 and 126 (MP1 and MN0), $V_{IN(L)}$ can be set at a safe voltage for the third voltage detector 146. Before transistor 124 (MP1) is switched off and while the third voltage detector 146 is operating normally, transistor 126 (MN0) draws negligible current from the input $V_{IN(L)}$ because its gate-threshold is much higher than $V_{IN(L)}$ and thus this transistor operates in its deep subthreshold region.

The voltage detector system described herein combines ultra-low power consumption, low detection threshold and wide operating range. It is useful for a wide variety of applications including high- and low-side signal monitoring and power-gating, but also for low power control components such as oscillators, gate-drives, and switching devices in low-power converters. For example, due to the voltage detector system's low quiescent input current, capacitive or resistive divider circuits using 100-1000 MΩ resistors can be used to adjust the detection threshold, for example to operate a load only over a desired rail voltage band, commonly referred to as Under-Voltage Lockout. Similarly, high value MΩ pull-up resistors can be used to convert the output into a 2-level output, for example for use in ring oscillators, timers, clocks, wake-up circuits, and pulse generating circuits. This ability to use high-impedance (capacitive or resistive) peripheral components leads to control circuits that use only a few nA of current, which is important for the miniaturisation of wireless sensor nodes, wearable medical health sensors, and internet of things devices.

The above embodiments are described by way of example only. Many variations are possible without departing from the invention as defined by the appended claims.

The invention claimed is:

1. A voltage detector comprising:
a first voltage reference generator generating a first voltage reference signal;
a second voltage reference generator for generating a second voltage reference signal, wherein the first voltage reference signal is higher than the second voltage reference signal;
a trigger, powered by an input signal to the voltage detector, and having an input for receiving either the first or second voltage reference signal and an output for generating a detection signal; and
a switch for selectively connecting the input of the trigger to the first or second voltage reference signal, wherein:
the switch is operative to connect the input of the trigger to the first voltage reference signal when the detection signal output by the trigger is low and is operative to connect the input of the trigger to the second voltage reference signal when the detection signal output by the trigger is high; and
the first and second voltage reference generators of the voltage detector each comprise a first transistor, arranged to have a zero gate-source voltage, and a second transistor, connected as a diode, connected in series between the input signal and a common reference, wherein the first transistor has a lower gate threshold than the second transistor; and
the voltage detector comprises a third voltage reference generator for generating a third voltage reference signal, wherein the third voltage reference generator is configured to output the third voltage reference signal to the first and second voltage reference generators and the third voltage reference signal sets the body bias of the first transistor of each of the first and second reference generators.

2. A voltage detector according to claim 1, wherein the trigger comprises a PMOS transistor and an NMOS transistor connected so as to form an inverter.

3. A voltage detector according to claim 2 wherein the first and second reference voltage signals produced by the first and second voltage reference generators circuits are low enough to ensure that the inverter is in subthreshold mode when it switches.

4. A voltage detector according to claim 1 wherein the common reference is ground.

5. A voltage detector according to claim 1 comprising one or more buffers between the trigger and the output.

6. A voltage detector system for monitoring an input signal and outputting a detection signal when the voltage of the input signal meets a threshold, the voltage detector system comprising:
a first voltage detector having an input for receiving the input signal and an output for outputting a detection signal, wherein the first voltage detector is configured to output the detection signal when the voltage of the input signal meets a first rising input voltage threshold;
a second voltage detector having an input for receiving the input signal and an output for outputting a detection signal, wherein the second voltage detector is configured to output the detection signal when the voltage of the input signal meets a second rising input voltage threshold which is higher than the first threshold,
wherein the first and/or second voltage detector comprises:
a first voltage reference generator for generating a first voltage reference signal;
a second voltage reference generator for generating a second voltage reference signal, wherein the first voltage reference signal is higher than the second voltage reference signal;
a trigger, powered by an input signal to the voltage detector, and having an input for receiving either the first or second voltage reference signal and an output for generating a detection signal; and
a switch for selectively connecting the input of the trigger to the first or second voltage reference signal, wherein:
the switch is operative to connect the input of the trigger to the first voltage reference signal when the detection signal output by the trigger is low and is operative to connect the input of the trigger to the second voltage reference signal when the detection signal output by the trigger is high, and
wherein the output of the second voltage detector controls a connection between the input signal and the input of the first voltage detector such that when the voltage of the input signal meets the second rising input voltage threshold the connection between the input signal and the input of the first voltage detector is inhibited or disconnected.

7. A voltage detector system according to claim 6 further comprising:
a third voltage detector having an input for receiving the input signal and an output for outputting a detection signal, wherein the third voltage detector is configured to output a detection signal when the voltage of the input signal meets a third rising input voltage threshold which is higher than both the first threshold and the second threshold,
wherein the output of the third voltage detector controls a connection between the input signal and the input of the second voltage detector such that when the voltage of the input signal meets the third rising input voltage threshold the connection between the input signal and the input of the second voltage detector is inhibited or disconnected.

8. A voltage detector system as claimed in claim 7 wherein the third voltage detector comprises:
a first voltage reference generator for generating a first voltage reference signal;
a second voltage reference generator for generating a second voltage reference signal, wherein the first voltage reference signal is higher than the second voltage reference signal;
a trigger, powered by an input signal to the voltage detector, and having an input for receiving either the first or second voltage reference signal and an output for generating a detection signal, and
a switch for selectively connecting the input of the trigger to the first or second voltage reference signal, wherein:
the switch is operative to connect the input of the trigger to the first voltage reference signal when the detection signal output by the trigger is low and is operative to connect the input of the trigger to the second voltage reference signal when the detection signal output by the trigger is high.

9. A voltage detection system according to claim 6, wherein the first voltage detector is configured to cease outputting a detection signal when the voltage of the input signal meets a first falling input voltage threshold, wherein the first falling input voltage threshold is lower than the first rising input voltage threshold.

10. A voltage detection system according to claim 6, wherein the second voltage detector is configured to cease outputting a detection signal when the voltage of the input signal meets a second falling input voltage threshold, wherein the second falling input voltage threshold is lower than the second rising input voltage threshold.

11. A voltage detection system according to claim 7, wherein the third voltage detector is configured to cease outputting a detection signal when the voltage of the input signal meets a third falling input voltage threshold, wherein the third falling input voltage threshold is lower than the third rising input voltage threshold.

12. A voltage detection system according to claim 6 further comprising an open drain output stage, the output stage comprising a plurality of MOSFET devices, each MOSFET device having:
- a gate terminal connected to an output of a respective one of the voltage detectors;
- a source terminal connected to a common reference; and
- a drain terminal connected to an output terminal of the output stage.

13. A voltage detection system according to claim 9 further comprising an open drain output stage, the output stage comprising a plurality of MOSFET devices, each MOSFET device having:
- a gate terminal connected to an output of a respective one of the voltage detectors;
- a source terminal connected to a common reference; and
- a drain terminal connected to an output terminal of the output stage.

14. A voltage detection system according to claim 13, wherein a gate threshold of each MOSFET device is lower than the rising input threshold and the falling input threshold of the respective voltage detector to which the MOSFET device is connected.

15. A voltage detection system according to claim 10 further comprising an open drain output stage, the output stage comprising a plurality of MOSFET devices, each MOSFET device having:
- a gate terminal connected to an output of a respective one of the voltage detectors;
- a source terminal connected to a common reference; and
- a drain terminal connected to an output terminal of the output stage.

16. A voltage detection system according to claim 15, wherein a gate threshold of each MOSFET device is lower than the rising input threshold and the falling input threshold of the respective voltage detector to which the MOSFET device is connected.

17. A voltage detection system according to claim 11 further comprising an open drain output stage, the output stage comprising a plurality of MOSFET devices, each MOSFET device having:
- a gate terminal connected to an output of a respective one of the voltage detectors;
- a source terminal connected to a common reference; and
- a drain terminal connected to an output terminal of the output stage.

18. A voltage detection system according to claim 17, wherein a gate threshold of each MOSFET device is lower than the rising input threshold and the falling input threshold of the respective voltage detector to which the MOSFET device is connected.

* * * * *